United States Patent
Shimada et al.

[11] Patent Number: 5,920,574
[45] Date of Patent: Jul. 6, 1999

[54] METHOD FOR ACCELERATED TEST OF SEMICONDUCTOR DEVICES

[75] Inventors: Yasuhiro Shimada, Osaka; Keisaku Nakao; Atsuo Inoue, both of Kyoto; Masamichi Azuma, Shiga; Eiji Fujii, Osaka, all of Japan

[73] Assignee: Matsushita Electronics Corporation, Osaka, Japan

[21] Appl. No.: 08/932,894

[22] Filed: Sep. 18, 1997

[30] Foreign Application Priority Data

Sep. 27, 1996 [JP] Japan .................................. 8-256132

[51] Int. Cl.⁶ .............................. G11C 29/00; G01R 1/04
[52] U.S. Cl. ..................... 371/21.4; 324/158.1; 324/719; 324/765
[58] Field of Search ........................ 371/21.4; 324/158.1, 324/537, 765, 719, 76.11

[56] References Cited

U.S. PATENT DOCUMENTS

| | | | |
|---|---|---|---|
| 3,474,530 | 10/1969 | Ainslie et al. | 324/158.1 X |
| 4,483,629 | 11/1984 | Schwarz et al. | 324/158.1 |
| 4,739,258 | 4/1988 | Schwarz | 324/158.1 |
| 5,287,313 | 2/1994 | Okajima | 365/201 |
| 5,291,142 | 3/1994 | Ohmi | 324/158.1 X |
| 5,497,076 | 3/1996 | Kuo et al. | 324/158.1 |
| 5,696,452 | 12/1997 | Hemmenway et al. | 324/769 X |

FOREIGN PATENT DOCUMENTS

| | | |
|---|---|---|
| 4-313080 | 11/1992 | Japan . |
| 5-45380 | 2/1993 | Japan . |
| 5-164816 | 6/1993 | Japan . |

*Primary Examiner*—Hoa T. Nguyen
*Attorney, Agent, or Firm*—Merchant, Gould, Smith, Edell, Welter & Schmidt, P.A.

[57] ABSTRACT

A method for an accelerated test of semiconductor devices comprises the steps of determining a relational expression $t^1 = t_2^m$ between an information holding lifetime $t_1$ at a temperature $T_1$ and another lifetime $t_2$ at another temperature $T_2$, expressing the exponent m as a function of the temperature that is proportional to the Boltzmann's factor, and calculating the information holding lifetime $t_2$ at the temperature $T_2$ on the basis of the information holding lifetime $t_1$ at the temperature $T_1$ using the relational expression.

3 Claims, 8 Drawing Sheets

5,920,574

1

METHOD FOR ACCELERATED TEST OF SEMICONDUCTOR DEVICES

BACKGROUND OF THE INVENTION

The present invention relates to a method for an accelerated test of semiconductor devices whose memory cell comprises a ferroelectric thin film, wherein an information holding life time without power supply is evaluated by temperature acceleration.

Such an accelerated test is useful for evaluating the lifetime of a semiconductor device under a certain condition in a limited period. In the accelerated test an excessive voltage supply or an excessive operating temperature is applied to the device to be tested. Especially, temperature acceleration (an excessive operating temperature) is effective for testing the information holding lifetime of a nonvolatile memory or the deterioration lifetime of a metal junction when an operating voltage is not applied.

In a conventional accelerated temperature test the relationship between the lifetime $t_1$ under a use operating condition and the lifetime $t_2$ under an accelerated test condition is defined below using an acceleration factor K.

$$t_1 = K \times t_2 \quad (1)$$

The acceleration factor K is given below using an activating energy $E_a$ that limits a lifetime.

$$K = \exp(E_a/k \times (1/T_1 - 1/T_2)), \text{ where } T_2 > T_1 \quad (2)$$

Here, k is the Boltzmann's constant and the activation energy $E_a$ is experimentally determined by the temperature dependence of lifetime. For example, the activation energy is given as a gradient of a regression line that is fit to the plots of experimental result showing the relationship between the logarithm of the lifetime and the inverse of the temperature. This is based on an assumption that a probability for the reaction dominating the lifetime depends on the Boltzmann distribution. If two temperatures $T_1$ and $T_2$ are given, the acceleration factor K is determined directly from the above equation (2).

A variation of a physical quantity I that decreases along with elapsed can be expressed as a function of temperature and time. As shown in FIG. 7, the logarithm of the decreasing physical quantity I varies linearly (i.e., proportionally) to time t, and the gradient of the variation depends on the temperature. For example, a necessary time for the physical quantity I to vary from $I_0$ to I' is $t_1'$ under a condition of the temperature $T_1$, and $t_2'$ under a condition of the temperature $T_2$. The relationship between $t_1'$ and $t_2'$ is expressed by equation (1) using the acceleration factor K.

Similarly, when the physical quantity I varies from I' to I", the relationship between $t_1''$ and $t_2''$ is also expressed by the equation (1) using the same acceleration factor K. Thus, the relationship between $t_1$, and $t_2$ corresponding to the temperature $T_1$ and $T_2$ can be expressed by the equation (1) using the single acceleration factor K, independently from the decreasing rate of the physical quantity. Therefore, even if the lifetime is not defined clearly corresponding to a certain value of the physical quantity, an accelerated stress condition of the time $t_2$ and the temperature $T_2$ which is equivalent to a use condition of the time $t_1$ and temperature $T_1$ can be calculated using the acceleration factor K.

However, some physical quantities such as magnetization in permanent magnets or polarization charge in nonvolatile memories decrease linearly to a logarithm of time. In this case, the relationship between times $t_1$ and $t_2$ corresponding to the temperatures $T_1$ and $T_2$ is no longer expressed by equations (1) and (2) using the acceleration factor K. This is further explained below using FIG. 8.

The vertical axis of the coordinate shown in FIG. 8 is the decreasing physical quantity I and the horizontal axis is the logarithm of time t. In this case, the relationship between I and log t is linear. Slope of each line depends on the corresponding temperature. As shown in FIG. 8, $t_1$ and $t_2$ have a relationship defined by the following equation using a proportionality factor m at any physical quantity I.

$$m \times \log t_2 = \log t_1 \quad (3)$$

Therefore, the relationship between $t_1'$ and $t_2'$ is $$t_1' = t_2'^m \quad (4)$$

Thus, $t_1'/t_2' = t_2'^{m-1}$ and the relationship between $t_1''$ and $t_2''$ is expressed in the equation, $t_1'' = t_2''^{m-1}$. Since $t_2'$ is not equal to $t_2''$, the acceleration factor depends on a the stress time under a certain acceleration condition. Therefore, in this case, the physical quantity such as the lifetime or other measure for decrease can be determined only for a certain value m by calculating the ratio of log $t_1$ and log $t_2$.

An information, i.e., a logic state of a nonvolatile memory, is read by a sense amplifier that amplifies the differential voltage between a reference voltage and a voltage on a bit line after transferring an electric charge from a memory cell to the bit line. In this case it is difficult to determine the exact differential voltage (memory window) between the reference voltage and the voltage of the bit line whose logic state cannot be discriminated. Consequently, the required stress time $t_2$ for the accelerating temperature $T_2$ cannot be calculated based on the use operating temperature $T_1$ and the stress time $t_1$. As a result, it was difficult to perform an accelerated test based on a confident decay model.

SUMMARY OF THE INVENTION

The present invention provides a method for an accelerated test of semiconductor devices based on a confident decay model when a decreasing physical quantity decreases linearly to the logarithm of time, by enabling calculation of a required accelerated stress time $t_2$ for an accelerating temperature $T_2$ corresponding to a use operating temperature $T_1$ and a stress time $t_1$.

The method of the present invention for an accelerated test of semiconductor devices comprises the steps of determining a relational expression $t_1 = t_2^m$ between an information holding lifetime $t_1$ (hours) at a temperature $T_1$ and another lifetime $t_2$ at another temperature $T_2$, expressing the exponent m as a function of the temperature, and calculating the required information holding lifetime $t_2$ at the temperature $T_2$ corresponding to the information holding lifetime $t_1$ at the temperature $T_1$ using the relational expression.

It is preferable to express the exponent m as a function of the temperature that is proportional to the Boltzmann's constant. This relational expression enables the calculation of the exponent from a temperature condition and another predetermined temperature condition even if the lifetime is not defined as clearly corresponding to a value of the decreasing physical quantity. As a result, the accelerated stress time at the accelerating temperature condition can be calculated corresponding to the stress time at the predetermined temperature, so that the accelerated test based on a model following the power law of time can be performed.

It is more preferable to determine an activation energy $E_a$ in Boltzmann's distribution from gradients of curves of the physical quantity that varies linearly to the logarithm of time under different temperatures, and to express the exponent m by the following relational expression;

$$m = \exp(E_a/k \times (1/T_1 - 1/T_2)),$$

where k is the Boltzmann constant and $T_2$ is greater than $T_1$. By using the exponent m given by the above expression, a required information holding lifetime $t_2$ at the temperature $T_2$ can be calculated on the basis of an information holding lifetime $t_1$ at the other temperature $T_1$.

DETAILED DESCRIPTION OF THE PREFERRED EMBODIMENTS

The preferred embodiment of the present invention is now explained using the figures. First, the performance of a ferroelectric capacitor constituting a nonvolatile memory used in the present invention is explained with reference to the hysteresis curves shown in FIG. 1A and 1B. In these figures, numeral 1 is the hysteresis curve of the ferroelectric capacitor.

Figure 1A:
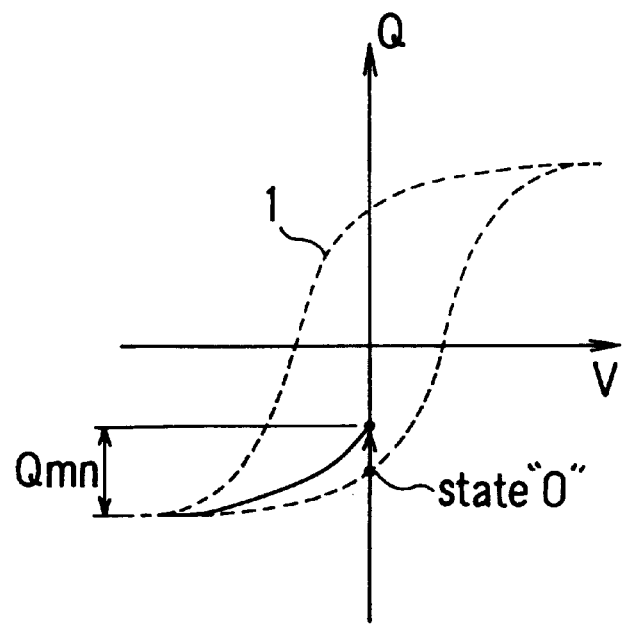
FIG. 1A is a graph showing a memorized logical state "0" in a hysteresis curve of a ferroelectric memory capacitor used in the present invention.
Figure 1B:
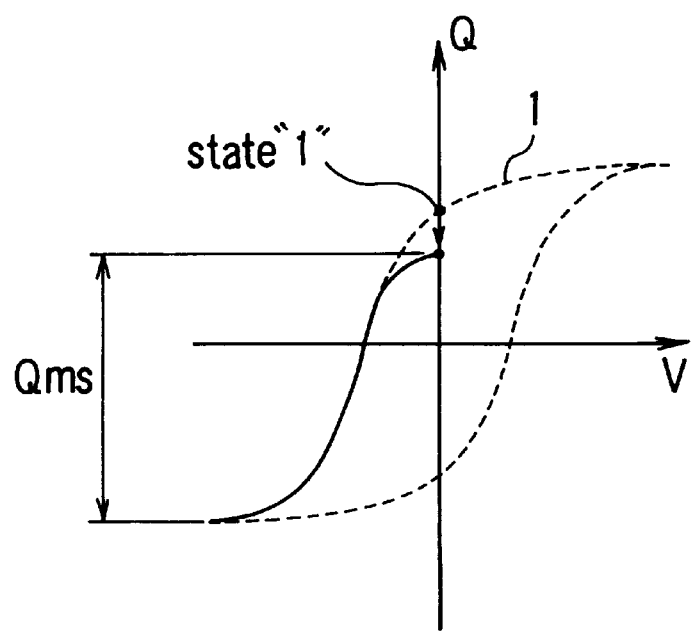
FIG. 1B is a graph showing a memorized logical state "1" in a hysteresis curve of a ferroelectric memory capacitor used in the present invention.

At room temperature, some ferroelectric capacitors are supplied with a predetermined pulse voltage to write information "0" or "1" into each capacitor as shown in FIG. 1A or 1B. The information is stored in each capacitor as a remnant charge, and the polarity of the remnant charge determines the logical state. A few seconds later, a pulse voltage, e.g., a negative pulse is applied to each ferroelectric capacitor to read an initial remnant charge. If the polarity of the pulse voltage for reading is the same as that used for writing the information, a non-switching charge Qmn is read as shown in FIG. 1A. On the contrary, if the polarities are opposite to each other, a switching charge Qms is read as shown in FIG. 1B.

Figure 2:
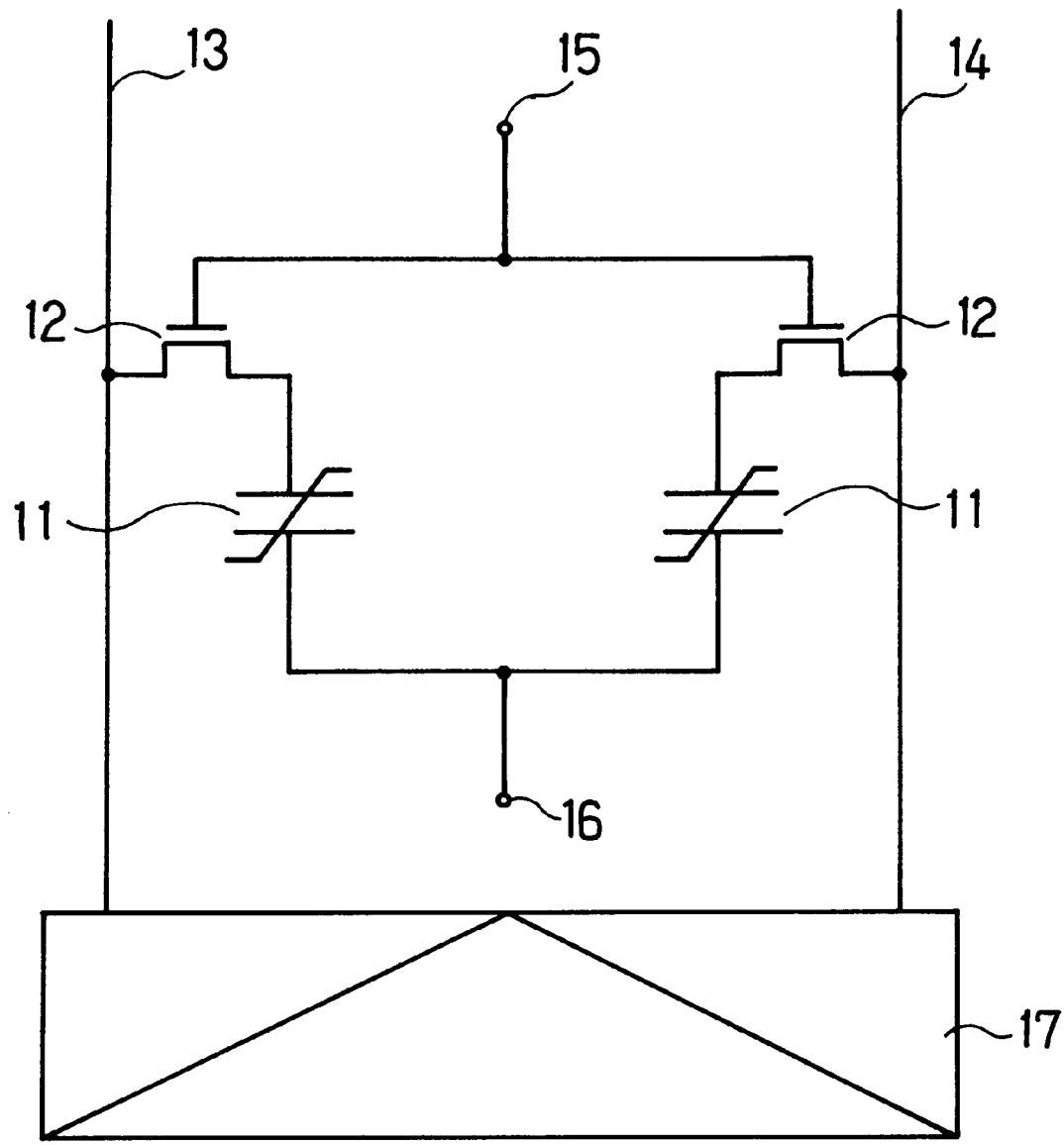
FIG. 2 shows an equivalent circuit of a memory cell used in the present invention.

Referring to FIG. 2, it is explained how the switching charge Qms and the non-switching charge Qmn are used for discriminating information states. FIG. 2 shows a basic circuit of a memory cell including two transistors and two ferroelectric capacitors. In this figure, numerals 11, 11 are ferroelectric capacitors, 12, 12 are access transistors, 13 is a bit line, 14 is a reverse bit line, 15 is a word line, 16 is a cell plate, and 17 is a sensing amplifier. In this circuit, the logical state "1" is written into one of the two capacitors 11, 11, and the logical state "0" is written into the other capacitor. In this situation, the bit line 13 and the complementary bit line 14 are set to zero potential level, the word line 15 is supplied with a voltage to activate the access transistor 12, and a pulse voltage is applied to the cell plate 16. As a result, the switching charge Qms is generated from the capacitor whose logical state is "1" and transferred to either the bit line 13 or the reverse bit line 14, while the non-switching charge Qmn is generated from the capacitor whose logical state is "0" and transferred to the other line 13 or 14.

A differential voltage is generated between the bit line 13 and the complemental bit line 14 due to the charge difference between the switching charge Qms and the non-switching charge Qmn. This differential voltage, which is approximately 100 millivolts, is amplified by the sensing amplifier 17 so that the differential voltage between the bit line 13 and the complemental bit line 14 can be discriminated clearly as a logical state. Therefore, it is important that there is a difference between the switching charge Qms and the non-switching charge Qmn to discriminate logical states. This difference value Qms–Qmn is called the "memory window".

If the polarity of the remnant charge has been reversed by initial reading, another pulse voltage is applied for restoring the original polarity.

Now to explain the present invention in more detail, plural ferroelectric capacitors whose remnant charge has been evaluated are divided into three groups for storing them in three thermostatic chambers, which are controlled to be at different temperatures, $T_1$, $T_2$ and $T_3$ ($T_3 > T_2 > T_1$). After a predetermined time, some ferroelectric capacitors are taken out of each group for measuring the switching and non-switching charges by applying a pulse voltage for reading. After the passing of another predetermined time, some ferroelectric capacitors are taken out of each group for measuring the switching and non-switching charges by applying a pulse voltage for reading. This operation is repeated predetermined times or for predetermined hours to investigate a variation of the memory window at high storage temperature.

Figure 3:
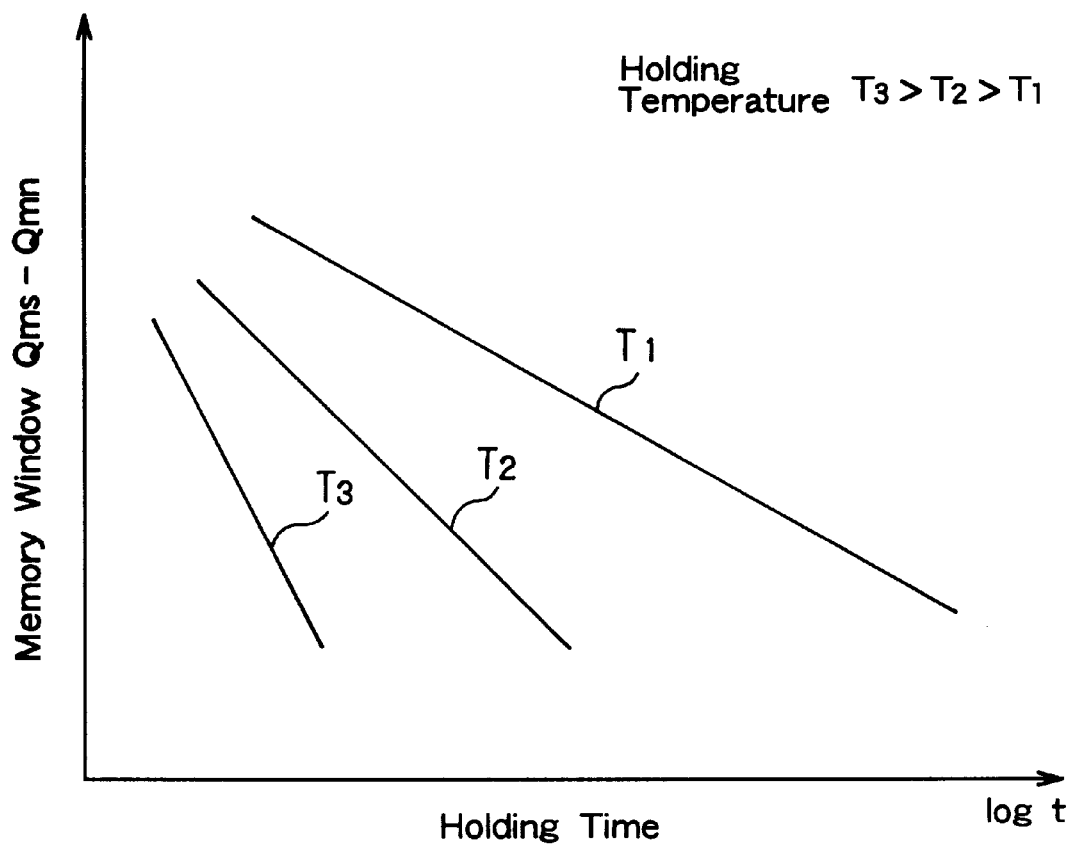
FIG. 3 is a graph showing variations of a memory window with a parameter of temperature.
Figure 4:
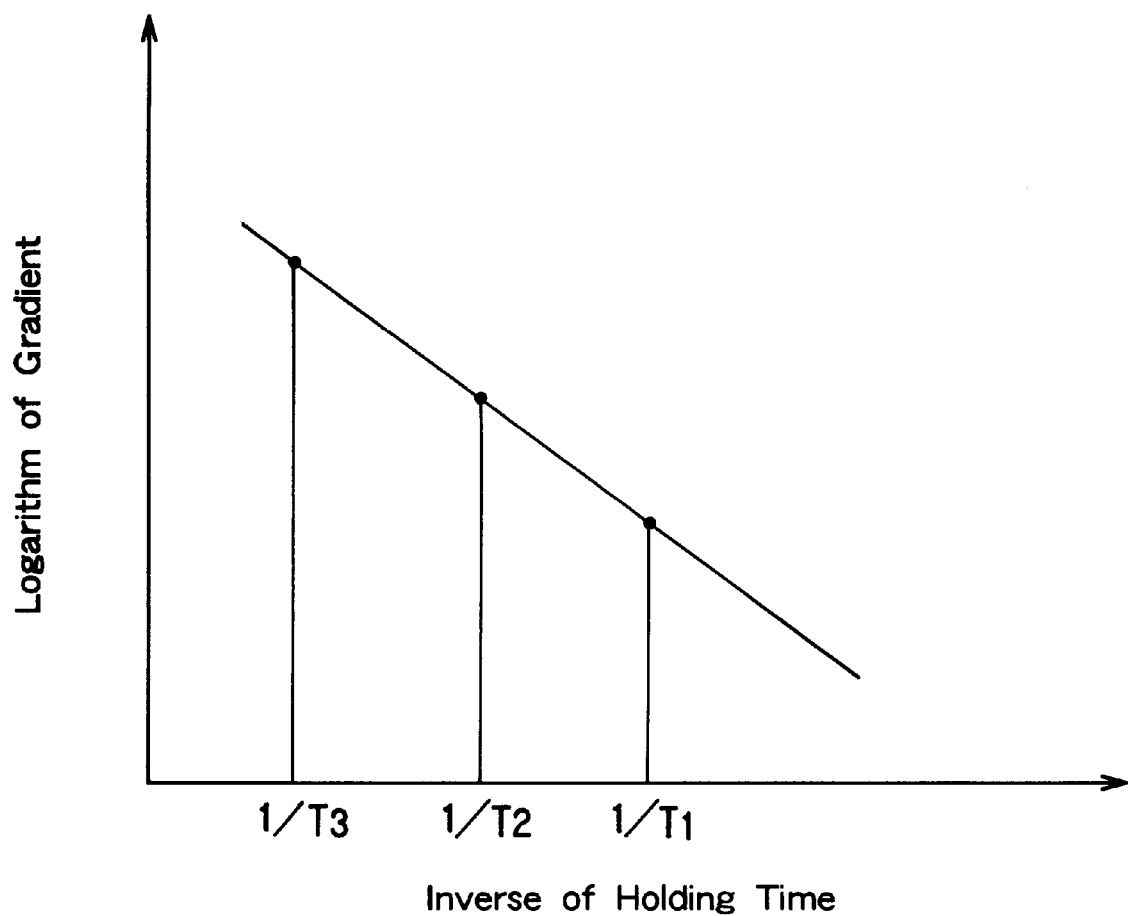
FIG. 4 is a graph showing the relationship between the variation gradient of the memory window and temperature shown in FIG. 3.

FIG. 3 shows an example of the result of a storage test under the three temperature conditions mentioned above. As shown in FIG. 3, the memory window at each temperature decreases linearly to the logarithm of the storage time. The gradient of the variation line is larger when the storage temperature is higher.

The inventors found that the above mentioned gradient of the line was proportional to Boltzmann's distribution, i.e., $\exp(E_a/kT)$, where $E_a$ is the activation energy for decreasing the memory window, k is the Boltzmann's constant, and T is the absolute temperature. Therefore, the relationship between the logarithm of the gradient and the reciprocal of temperature is substantially linear when plotting on the logarithm of the gradient versus the reciprocal of absolute temperature. Then, the activation energy $E_a$ can be calculated from the gradient of the line corresponding to the relationship between the logarithm of the gradient and the inverse of the temperature.

In FIG. 3, a gradient ratio m of two lines corresponding to different storage temperatures $T_1$, $T_2$ can be calculated according to the following equation after obtaining a value of the activation energy $E_a$.

$$m = \exp(E_a/k \times (1/T_1 - 1/T_2)), \text{ where } T_2 > T_1 \quad (5)$$

If the values of temperatures $T_1$ and $T_2$ are given, the exponent m can be calculated using equation (5). Thus, the accelerated stress time $t_2$ at the accelerating temperature $T_2$ can be calculated corresponding to the stress time $t_1$ at the use operating temperature $T_1$ according to the equation (4). As a result, an accelerated test based on the power law model can be performed.

In this embodiment, the memory window means the charge difference Qms–Qmn between the switching charge Qms and the non-switching charge Qmn. However, the same result can be obtained if the voltage difference between the bit line and the complemental bit line is adopted as the memory window.

The present invention can be applied to various types of memory device, not limited to the ferroelectric nonvolatile memory having a memory cell with two transistor and two capacitor structure mentioned above. If a physical quantity corresponding to a memory function decreases linearly to the logarithm of time, not depending on the configuration of the memory cell, and even if the activation energy for decreasing the physical quantity is different, the testing time for the desired accelerating temperature or the accelerating temperature for the desired testing time can be calculated on the basis of the power law model using the activation energy calculated according to the above-mentioned procedure.

Figure 5:
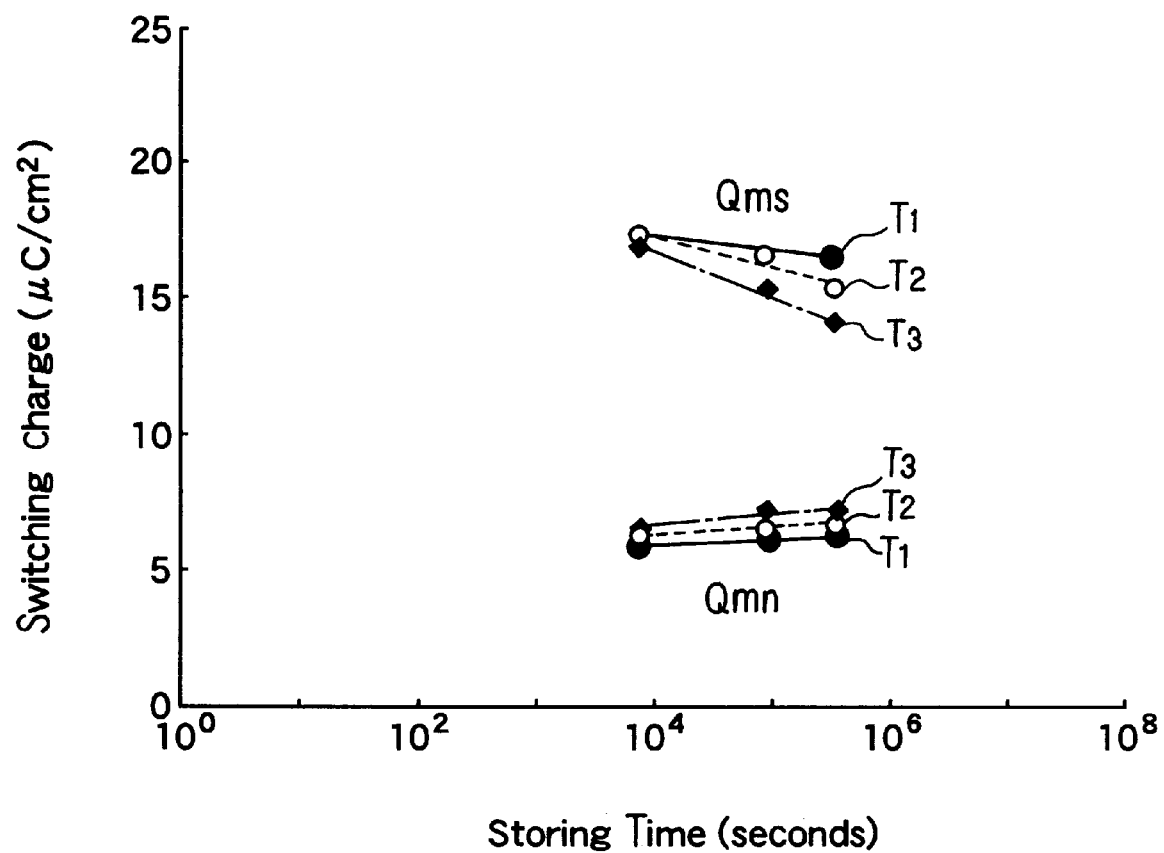
FIG. 5 is a graph showing a result of a storing test at the temperature $T_1$, $T_2$ and $T_3$.
Figure 6:
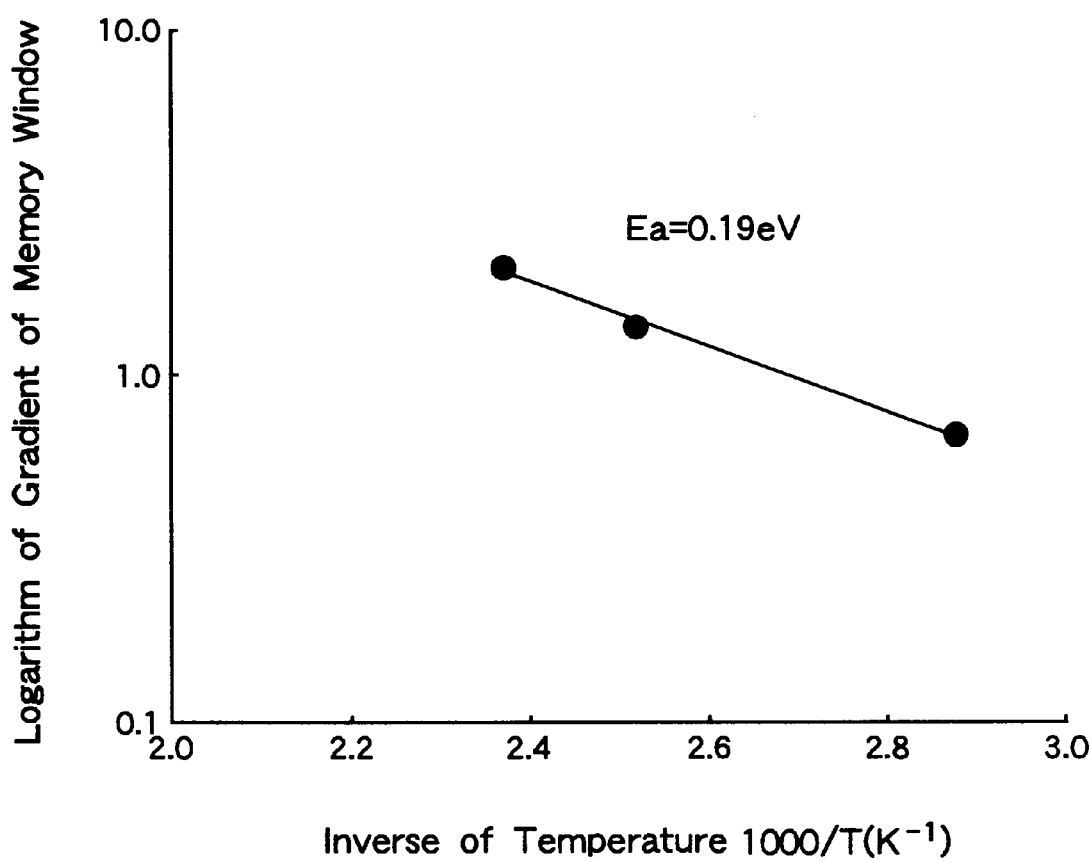
FIG. 6 is a graph showing the relationship between the variation gradient of the memory window and temperature shown in FIG. 5.
Figure 7:
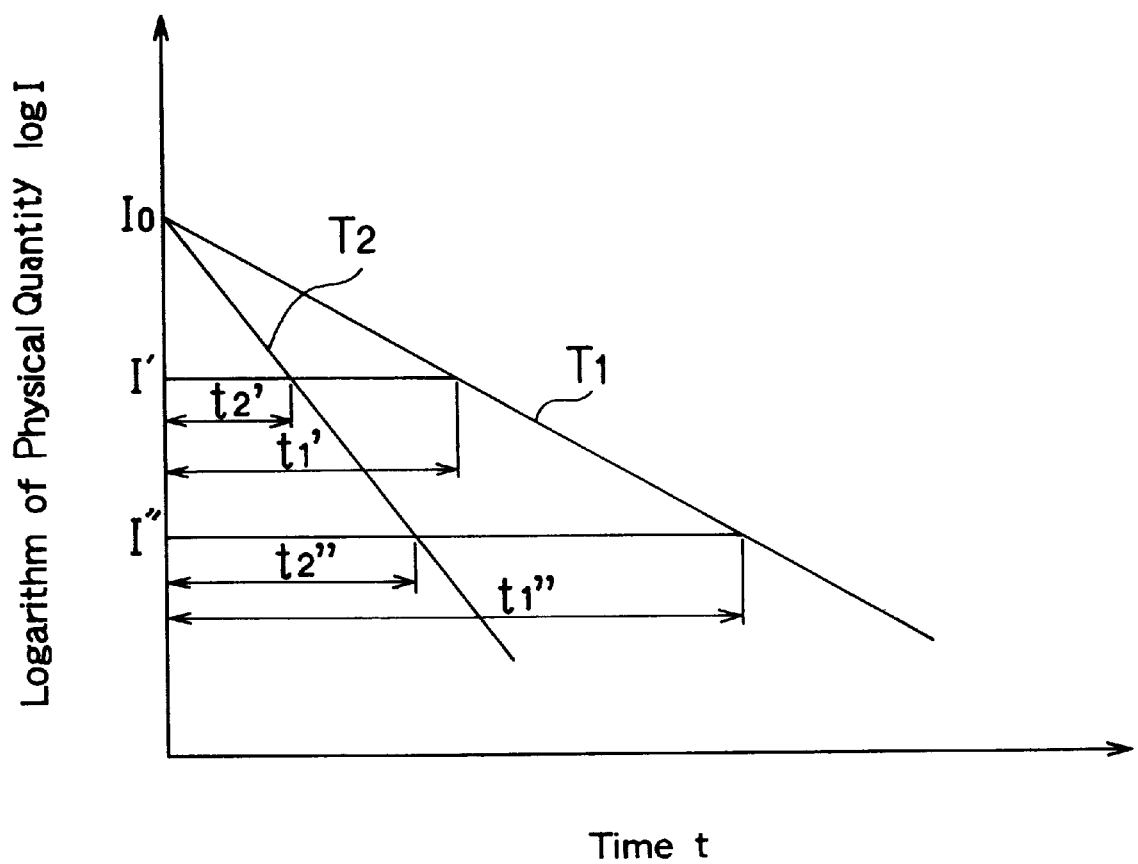
FIG. 7 is a graph showing variations of a physical quantity that decreases linearly to time, with a parameter of temperature.
Figure 8:
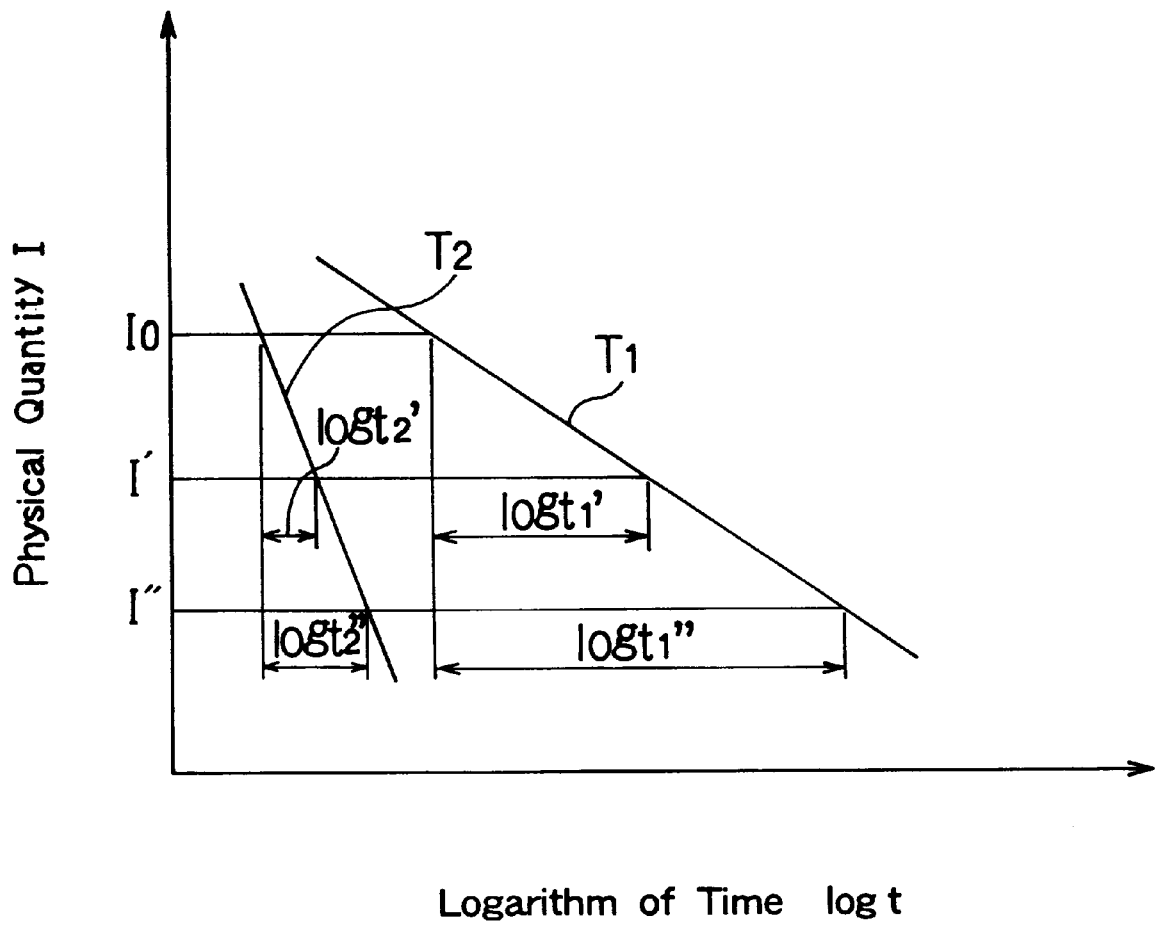
FIG. 8 is a graph showing variations of a physical quantity that decreases linearly to the logarithm of time, with a parameter of temperature.

The following explanation is directed to a specific example of the present invention. $SrBi_2Ta_2O_9$ thin film was used for a ferroelectric material of the ferroelectric capacitor used in this example. The size of the capacitor was approximately 5×5 square microns. A writing voltage before high temperature storing test and a reading voltage for reading the remnant charge was approximately 3 volts. FIG. 5 shows a result of the storing test at the temperature $T_1$ (75 degrees Celsius, 348K), $T_2$ (125 degrees Celsius, 398K), and $T_3$ (150 degrees Celsius, 423K). FIG. 6 shows the relationship between the temperature and the logarithm of gradient of the memory window that can be read from FIG. 5. The activation energy $E_a$ was calculated from the gradient of the line in FIG. 6 as 0.19 electron volts. Using this value of $E_a$, the exponent m and the testing time $t_2$ for several storing temperatures $T_2$, corresponding to the storing temperature $T_1$=75 degrees Celsius and the testing time $t_1$=10 years, were calculated by the equation (4) and (5). The results are shown in Table 1.

TABLE 1

| $T_2$ (degrees C.) | m | $t_2$ (hours) |
| --- | --- | --- |
| 75 | 1.0 | 8.7 × 10$^4$ (= 10 years) |
| 100 | 1.53 | 1692 |

TABLE 1-continued

| $T_2$ (degrees C.) | m | $t_2$ (hours) |
| --- | --- | --- |
| 125 | 2.21 | 175 |
| 150 | 3.07 | 41 |

As shown in Table 1, the required storing time $t_2$ for a storing temperature $T_2$=150 degrees Celsius is only 41 hours corresponding to the condition of $T_1$=75 degrees Celsius and $t_1$=10 years, for example.

The same result can be obtained if a properly designed software program or a testing machine including the software program is used for estimating a lifetime on the basis of the accelerated testing method according to the present invention.

As explained above, according to the present invention, even if the information holding lifetime is not defined clearly corresponding to a value of the physical quantity such as a holding charge, the exponent m can be calculated using a temperature $T_1$ and another temperature $T_2$. Therefore, the required stress time $t_2$ for the accelerating temperature $T_2$ can be calculated if the stress time $t_1$ for the temperature $T_1$ is given. Thus, an accelerated test based on the power law model can be performed.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

We claim:

1. A method for an accelerated test of semiconductor devices whose memory cell comprises a ferroelectric thin film, by evaluating an information holding lifetime without power supply with temperature acceleration, the method comprising the steps of:

determining a relational expression $t_1 = t_2^m$ between an information holding lifetime $t_1$ at a temperature $T_1$ and another lifetime $t_2$ at another temperature $T_2$;

expressing the exponent m as a function of the temperature; and calculating the information holding lifetime $t_2$ at the temperature $T_2$ on the basis of the information holding lifetime $t_1$ at the temperature $T_1$ using the relational expression.

2. The method according to claim 1, wherein the expressing step includes expressing the exponent m as a function of the temperature that is proportional to Boltzmann's factor.

3. The method according to claim 1, wherein the expressing step includes determining an activation energy $E_a$ in Boltzmann's factor from gradients of curves of the physical quantity that varies linearly to the logarithm of time under different temperatures, and expressing the exponent m by the following relation;

$$m = \exp(E_a/k \times (1/T_1 - 1/T_2)),$$

where k is Boltzmann's constant and $T_2$ is greater than $T_1$.

* * * * *